United States Patent
Mathe et al.

(10) Patent No.: US 9,537,450 B2
(45) Date of Patent: *Jan. 3, 2017

(54) DYNAMIC HEADROOM FOR ENVELOPE TRACKING

(71) Applicant: QUALCOMM Incorporated, San Diego, CA (US)

(72) Inventors: Lennart Karl-Axel Mathe, San Diego, CA (US); Pengfei Li, San Diego, CA (US); Song S. Shi, San Diego, CA (US); Yunfei Shi, San Diego, CA (US); Joseph D. Rutkowski, Chandler, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/488,114

(22) Filed: Sep. 16, 2014

(65) Prior Publication Data

US 2015/0002235 A1 Jan. 1, 2015

Related U.S. Application Data

(63) Continuation of application No. 13/752,287, filed on Jan. 28, 2013, now Pat. No. 8,866,547.

(51) Int. Cl.
*H03F 1/02* (2006.01)
*H03F 3/21* (2006.01)
(Continued)

(52) U.S. Cl.
CPC .......... *H03F 1/0222* (2013.01); *H03F 1/0227* (2013.01); *H03F 3/19* (2013.01);
(Continued)

(58) Field of Classification Search
USPC .................. 330/297, 127, 129, 134, 279
See application file for complete search history.

(56) References Cited

U.S. PATENT DOCUMENTS 6,091,297 A   7/2000   Bar-David et al.
6,437,641 B1  8/2002   Bar-David
(Continued)

FOREIGN PATENT DOCUMENTS

WO   0237672 A2     5/2002
WO   2011007556 A1  1/2011

OTHER PUBLICATIONS

International Search Report and Written Opinion—PCT/US2014/012393—ISA/EPO—Oct. 23, 2014.

*Primary Examiner* — Hieu Nguyen
(74) *Attorney, Agent, or Firm* — Arent Fox LLP

(57) ABSTRACT

Techniques for dynamically generating a headroom voltage for an envelope tracking system. In an aspect, an initial headroom voltage is updated when a signal from a power amplifier (PA) indicates that the PA headroom is insufficient. The initial headroom voltage may be updated to an operating headroom voltage that includes the initial voltage plus a deficiency voltage plus a margin. In this manner, the operating headroom voltage may be dynamically selected to minimize power consumption while still ensuring that the PA is linear. In a further aspect, a specific exemplary embodiment of a headroom voltage generator using a counter is described.

13 Claims, 9 Drawing Sheets

(51) Int. Cl.
 *H03F 3/19* (2006.01)
 *H03F 3/24* (2006.01)

(52) U.S. Cl.
 CPC .............. *H03F 3/21* (2013.01); *H03F 3/245* (2013.01); *H03F 2200/102* (2013.01); *H03F 2200/451* (2013.01)

(56) References Cited

U.S. PATENT DOCUMENTS

| | | |
|---|---|---|
| 6,492,867 B2 | 12/2002 | Bar-David |
| 6,831,519 B2 | 12/2004 | Bar-David et al. |
| 6,985,039 B2 | 1/2006 | Bar-David et al. |
| 7,046,090 B2 | 5/2006 | Veinblat |
| 7,257,384 B2 | 8/2007 | Bar-David et al. |
| 7,348,847 B2 | 3/2008 | Whittaker |
| 7,443,244 B2 | 10/2008 | Hagen |
| 7,710,203 B2 | 5/2010 | Bar-David et al. |
| 7,728,663 B2 | 6/2010 | Rabjohn et al. |
| 7,782,132 B2 | 8/2010 | Plotnik et al. |
| 7,899,417 B2 | 3/2011 | Elia |
| 7,932,780 B2 | 4/2011 | Elia |
| 8,107,902 B2 | 1/2012 | Elia |
| 8,149,061 B2 | 4/2012 | Schuurmans |
| 8,193,860 B2 | 6/2012 | Cohen |
| 8,212,620 B2 | 7/2012 | Strickland et al. |
| 8,698,558 B2 | 4/2014 | Mathe et al. |
| 2006/0068830 A1 | 3/2006 | Klomsdorf et al. |
| 2008/0220826 A1* | 9/2008 | Dagher et al. ................ 455/572 |
| 2009/0098846 A1 | 4/2009 | Elia |
| 2010/0105343 A1 | 4/2010 | Stebbings et al. |
| 2013/0214862 A1 | 8/2013 | Presti et al. |
| 2014/0111276 A1 | 4/2014 | Mathe et al. |
| 2014/0210559 A1 | 7/2014 | Mathe et al. |

\* cited by examiner

DYNAMIC HEADROOM FOR ENVELOPE TRACKING

Claim of Priority under 35 U.S.C. §120

The present Application for Patent is a continuation of patent application Ser. No. 13/752,287, now U.S. Pat. No. 8,866,547, entitled "DYNAMIC HEADROOM FOR ENVELOPE TRACKING," filed on Jan. 28, 2013, pending, assigned to the assignee hereof, and expressly incorporated by reference herein in its entirety.

BACKGROUND

Field

The disclosure relates to envelope tracking for power amplifiers.

Background

Envelope tracking is a technique for increasing the efficiency of power amplifiers. In an envelope tracking (ET) system, the supply voltage of a power amplifier is dynamically adjusted to keep the power amplifier operating with sufficient headroom to maintain linearity, while nevertheless minimizing DC power consumption. The supply voltage of the power amplifier is commonly generated using a separate linear amplifier that tracks the envelope of the power amplifier output. In certain prior art implementations, the linear amplifier is itself coupled to an amplifier supply voltage generated by a boost converter, which is capable of generating a boosted supply voltage for the linear amplifier that exceeds the maximum supply voltage otherwise available to the system, e.g., a battery voltage. In this manner, the power amplifier output can reach and even exceed the battery voltage when necessary.

The amplifier supply voltage is typically set to be higher than the peak required power amplifier output plus some additional headroom voltage. In certain prior art implementations, this headroom voltage is a static value that is pre-programmed and not updated over time. However, as the preferred headroom voltage may vary considerably across different operating scenarios, e.g., across different processes, temperatures, load conditions, etc., a single static value for the headroom voltage may not be optimal in all cases. Furthermore, a headroom voltage that is chosen too low may undesirably lead to startup failure in the boost converter, which would compromise the linearity of the system.

It would be desirable to provide techniques for dynamically determining the optimal headroom voltage for an ET system according to the particular operating scenario, and further for preventing startup failure for boost converters in ET systems.

DETAILED DESCRIPTION

Figure 1:
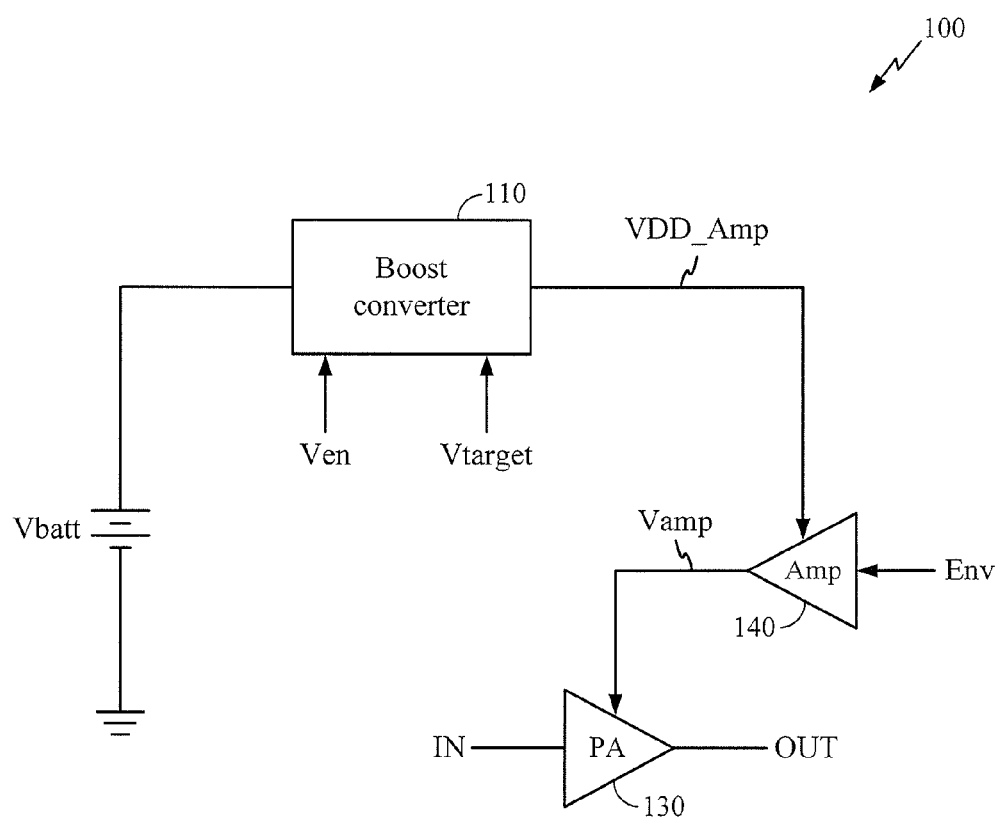
FIG. 1 illustrates a prior art implementation of an envelope tracking (ET) system.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein. In this specification and in the claims, the terms "module" and "block" may be used interchangeably to denote an entity configured to perform the operations described.

Note in this specification and in the claims, the denotation of a signal or voltage as being "high" or "low" may refer to such signal or voltage being in a logical "high" or "low" state, which may (but need not) correspond to a "TRUE" (e.g., =1) or "FALSE" (e.g., =0) state for the signal or voltage. It will be appreciated that one of ordinary skill in the art may readily modify the logical conventions described herein, e.g., substitute "high" for "low" and/or "low" for "high," to derive circuitry having functionality substantially equivalent to that described herein. Such alternative exemplary embodiments are contemplated to be within the scope of the present disclosure.

FIG. 1 illustrates a prior art implementation of an envelope tracking (ET) system 100. Note FIG. 1 is shown for illustrative purposes only, and is not meant to limit the scope of the present disclosure to any particular implementation of an ET system. For example, the techniques described hereinbelow may readily be applied to systems incorporating alternative or additional modules not shown, such as a buck converter coupling Vbatt to Vamp for simultaneously generating a stepped-down voltage supply for the power amplifier.

In FIG. 1, a power amplifier (PA) 130 receives an input voltage IN and generates an amplified output voltage OUT. A voltage Vamp, also denoted a "tracking supply voltage," is provided to the PA 130 as a supply voltage. Vamp is generated at least in part by an amplifier 140, which may be a linear amplifier. The amplifier 140 is supplied by a voltage VDD_Amp, also denoted an "amplifier supply voltage." In certain implementations of an ET system, to generate Vamp, the amplifier 140 may amplify a voltage Env which tracks the envelope of the PA output voltage OUT.

The tracking supply voltage Vamp provided to the PA 130 may be maintained at a level sufficient to ensure linear operation of the PA 130, i.e., provided with sufficient "headroom," while reducing unnecessary DC power consumption. Note as mentioned hereinabove, in certain implementations, a buck converter (not shown) may be concurrently provided to supply the PA 130, e.g., coupled to the PA 130 at Vamp to increase the power driving capability of the PA 130.

In certain operating scenarios, to maintain sufficient headroom for the PA, it may be necessary to drive Vamp to a level that exceeds the level of Vbatt, also denoted a "boost supply voltage," which is a maximum supply voltage otherwise available to the system, e.g., a supply voltage from a battery of the system. To allow the amplifier 140 to generate an output Vamp that is higher than Vbatt, a boost converter 110 may be provided to generate VDD_Amp. The boost converter 110 may boost VDD_Amp to a higher level than Vbatt according to principles of operation not shown in FIG. 1 but known in the art, e.g., using a plurality of switches alternately configured to charge and discharge an inductor to generate a boosted output voltage.

To increase the efficiency of the ET system, the boost converter 110 may be turned on or enabled only when necessary, e.g., when it is determined that VDD_Amp needs to rise above Vbatt to maintain sufficient headroom for the PA 130. As such, the boost converter 110 may receive as input an "enable" signal voltage Ven indicating when VDD_Amp should be boosted to a level higher than VBatt. The boost converter 110 may also be provided with a target voltage Vtarget to which VDD_Amp should be boosted when the boost converter 110 is enabled. It will be appreciated that when it is not necessary to provide VDD_Amp higher than Vbatt, then the boost converter 110 may be turned off or disabled, or otherwise provided in a "bypass" mode that directly couples Vbatt to VDD_Amp.

Figure 2:
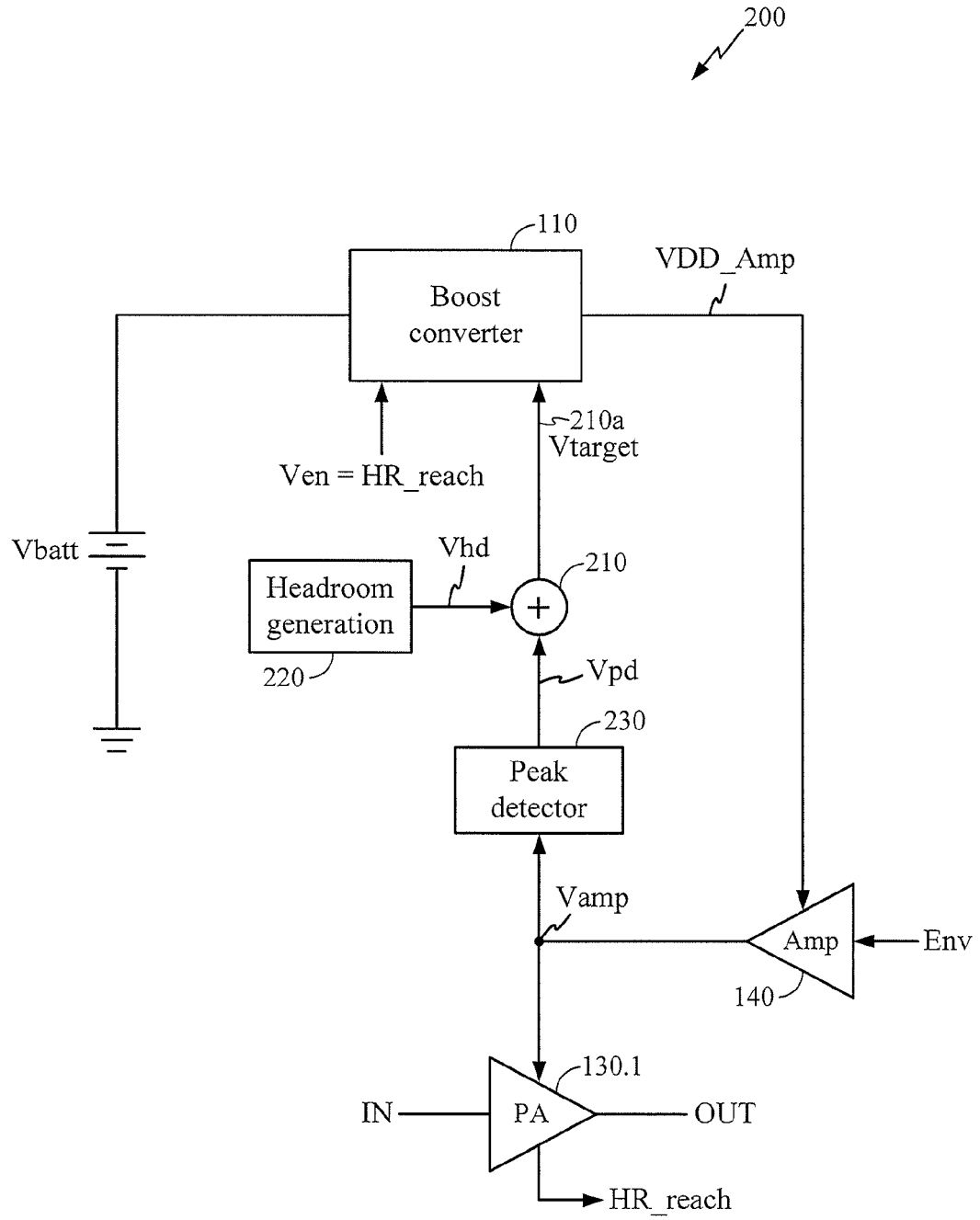
FIG. 2 illustrates an implementation of an ET system wherein Ven and Vtarget are generated in the particular manner shown.

FIG. 2 illustrates an implementation of an ET system 200 wherein Ven and Vtarget are generated in the particular manner shown. Note FIG. 2 is shown for illustrative purposes only, and is not meant to limit the scope of the present disclosure to any particular techniques for generating Ven and/or Vtarget.

In FIG. 2, a specific implementation 130.1 of the PA 130 generates a voltage HR_reach, also denoted a "headroom reached signal," indicating when a voltage headroom of the PA 130.1 is (or is close to being) insufficient to maintain PA linearity. For example, HR_reach may be asserted high whenever one or more transistors (not shown) in the PA 130.1 becomes saturated. For example, in an exemplary embodiment, a voltage amplifier may be provided to sense the voltage drop across the drain and source of a transistor of the PA 130.1, and the sensed voltage drop may be compared to a predetermined threshold voltage by a voltage comparator. If the voltage drop across the transistor is less than or equal to the predetermined threshold voltage, then HR_reach may be asserted high. In this case, the predetermined threshold voltage may correspond to a value at which the corresponding transistor is expected to be saturated.

In FIG. 2, HR_reach is directly coupled to the boost converter 110 as Ven. In this manner, whenever HR_reach indicates that the voltage headroom of the PA 130.1 is insufficient, the boost converter 110 is also enabled. Note in alternative implementations, a latch or other memory element may also be provided to process HR_reach prior to supplying to the boost converter 110, to hold the value of Ven for, e.g., a predetermined amount of time, in view of potential transient toggling in the value of HR_reach.

Further shown in FIG. 2 is a peak detector 230 coupled to Vamp to generate a voltage Vpd corresponding to the detected peak value of Vamp, e.g., over a predetermined time interval. A headroom generation block 220 is also provided to generate a predetermined "headroom voltage" Vhd. In the implementation shown, Vhd is added to Vpd using an adder 210 to generate the boost target voltage Vtarget, or 210a. It will be appreciated that, when enabled, the boost converter 110 may drive the amplifier supply voltage VDD_Amp to the target voltage Vtarget.

Note FIG. 2 is shown for illustrative purposes only, and is not meant to limit the scope of the present disclosure to ET systems wherein Ven and Vtarget are necessarily generated as shown. For example, in certain implementations, Vtarget may be generated as shown in FIG. 2, while Ven may be generated using other techniques known in the art (not shown in FIG. 2); similarly Ven may be generated as shown, and Vtarget generated using other techniques. Such alternative implementations are contemplated to be within the scope of the present disclosure.

Figure 3:
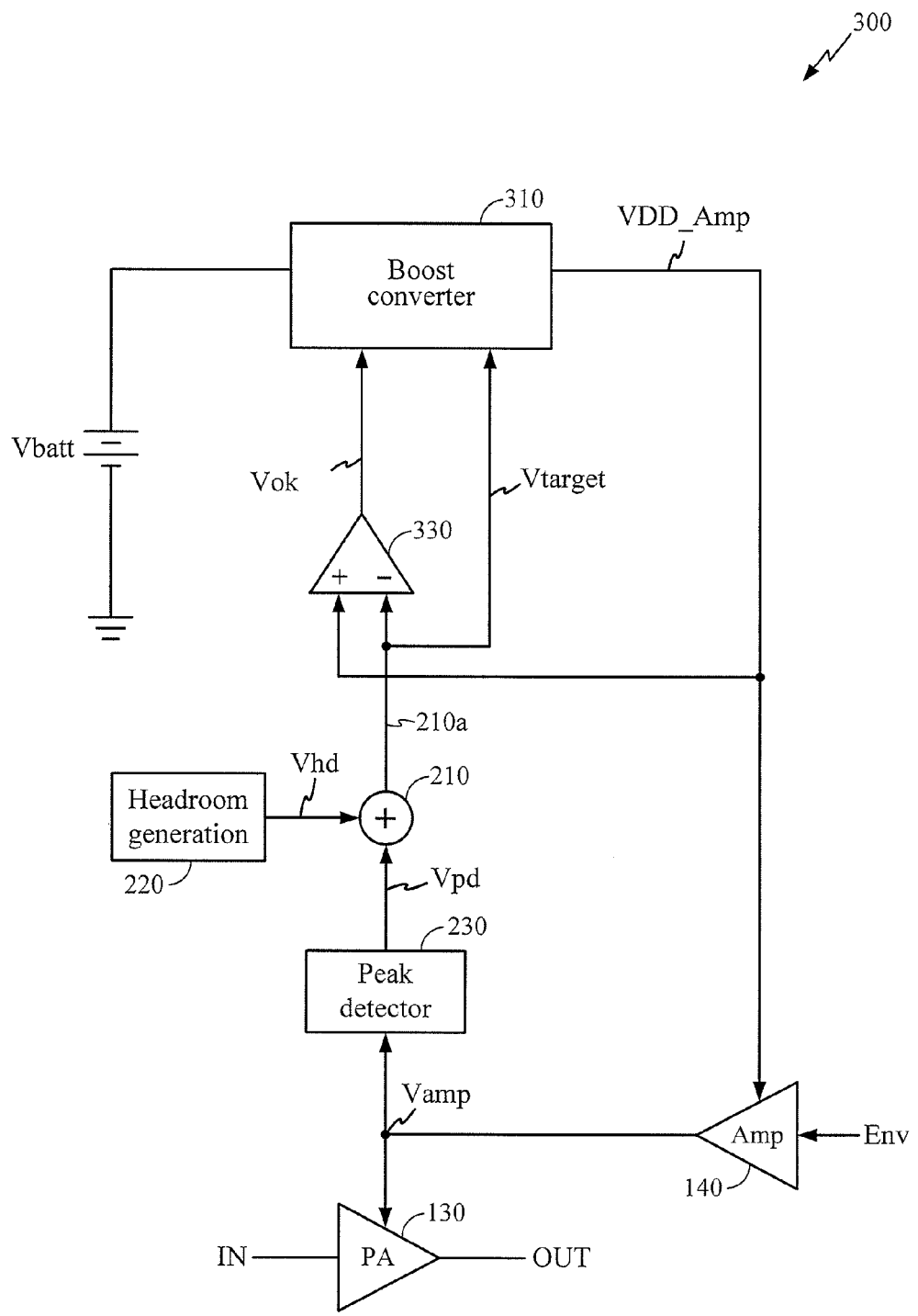
FIG. 3 illustrates an alternative implementation of an ET system.

FIG. 3 illustrates an alternative implementation 300 of an ET system. Note similarly labeled elements in FIGS. 2 and 3 may correspond to elements performing similar functionality, unless otherwise noted. Note the boost converter 310 in FIG. 3 is shown for illustrative purposes only, and it will be appreciated that the boost converter 110 in FIG. 1 may also be used in the ET system 300 by modifying the signaling conventions in a manner that will be apparent to one of ordinary skill in the art. Such alternative exemplary embodiments are contemplated to be within the scope of the present disclosure.

In FIG. 3, as in the ET system 200, Vtarget for the boost converter 110 is generated as the output 210a of the adder 210. A voltage Vok is generated at the output of a comparator 330, which compares VDD_Amp at its positive (+) input terminal with the output 210a of the adder 210 at its negative (−) input terminal. It will be appreciated that Vok being high indicates that the current amplifier supply voltage VDD_Amp exceeds Vtarget; in this case, the boost converter 310 need not be enabled, as there is ample headroom in the PA.

Note when the boost converter 310 is enabled, VDD_Amp may have a DC value equal to Vtarget, yet there may be an AC component in VDD_Amp, and therefore Vok may be alternately toggling between high and low values over time. Accordingly, Ven can thus be generated as a filtered and/or latched version of the inverse of Vok. In particular, in certain exemplary embodiments, logic circuitry (not shown) may be provided to derive Ven from Vok using, e.g., an inverter (not shown), as well as a latch for periodically latching the potentially alternately toggling value of Vok.

According to the ET system 300, when the sum of the detected peak (Vpd) and the headroom Vhd exceeds VDD_Amp, then Vok will be low (e.g., Ven will be high), and the boost converter 310 will be enabled. Per the description hereinabove, it will be appreciated that Vok will be low only when the detected peak level Vpd of Vamp is within a voltage drop Vhd of VDD_Amp, i.e., when Vpd>VDD_Amp−Vhd. In this specification and in the claims, the state of Vok being low is also denoted as corresponding to a signal indicating that the amplifier supply voltage is less than the sum of the headroom voltage and the peak of the tracking supply voltage.

Note FIG. 3 and related exemplary embodiments are shown for illustrative purposes only, and are not meant to limit the scope of the present disclosure to any particular exemplary embodiments shown. One of ordinary skill in the art may readily derive alternative, equivalent logical signaling schemes in light of the present disclosure. For example, the comparator 330 may instead be configured to generate Vok' (i.e., the logical inverse of Vok) by switching the signal voltages coupled to the positive (+) and negative (−) input terminals, and the boost converter 310 may in that case be alternatively configured to directly process Ven, rather than Vok. Such alternative exemplary embodiments are contemplated to be within the scope of the present disclosure.

Furthermore, it will be appreciated that while components shown in FIG. 3 (and any other figure of the present specification) may generally process analog input and/or output voltages, any of such analog components may incorporate one or more digital-to-analog converters (DAC's) and/or analog-to-digital converters (ADC's) to allow internal digital processing of the signals. For example, the headroom generation block may incorporate a DAC (not shown).

In certain prior art implementations, the headroom generation block 220 in both FIGS. 2 and 3 may be configured to generate Vhd as a fixed predetermined voltage. In this case, the fixed value of Vhd may be chosen by design to approximate an "optimal" value Vhd_opt for the required headroom, e.g., a value for the headroom voltage that allows distortion-free operation of the PA 130 while simultaneously minimizing the DC power consumption. During normal operation, however, it will be appreciated that such an optimal value Vhd_opt may vary significantly across different operating scenarios, e.g., across different processes, temperatures, and load conditions. For example, in an instance, Vhd_opt may range from 150 mV to 400 mV depending on, e.g., the operating temperature of the PA 130.

It will be appreciated that if the fixed setting of Vhd is greater than the optimal headroom Vhd_opt for a given scenario, e.g., Vhd>Vhd_opt and therefore Vhd over-estimates Vhd_opt, then the supply voltage VDD_Amp for the amplifier 140 may be over-boosted. In this case, although the PA 130 operates distortion-free, power is unnecessarily wasted. On the other hand, if Vhd is less than the optimal headroom Vhd_opt for a given scenario, e.g., Vhd<Vhd_opt and therefore Vhd under-estimates Vhd_opt, then distortion may be undesirably introduced into the output of amplifier 130.

For the specific ET system 300 shown in FIG. 3, it will be appreciated that a further problem associated with Vhd<Vhd_opt is that the boost converter 310 may fail to start up altogether in certain cases. In particular, to maintain sufficient headroom, the boost converter 310 should be enabled when Vamp exceeds (VDD_Amp−Vhd_opt); however, given that Vhd<Vhd_opt, the boost converter 310 will in fact not be enabled until Vamp exceeds (VDD_Amp−Vhd), which would be a level higher than (VDD_Amp−Vhd_opt). In other words, the boost converter 310 would be enabled too late, or perhaps not at all, in those cases where Vhd<Vhd_opt, thus adversely impacting the linearity of the PA 130.

It would be desirable to provide techniques for setting the headroom voltage Vhd to optimize the trade-offs between maximizing linearity and minimizing power consumption, and further to minimize the possibility of boost startup failure.

Figure 4:
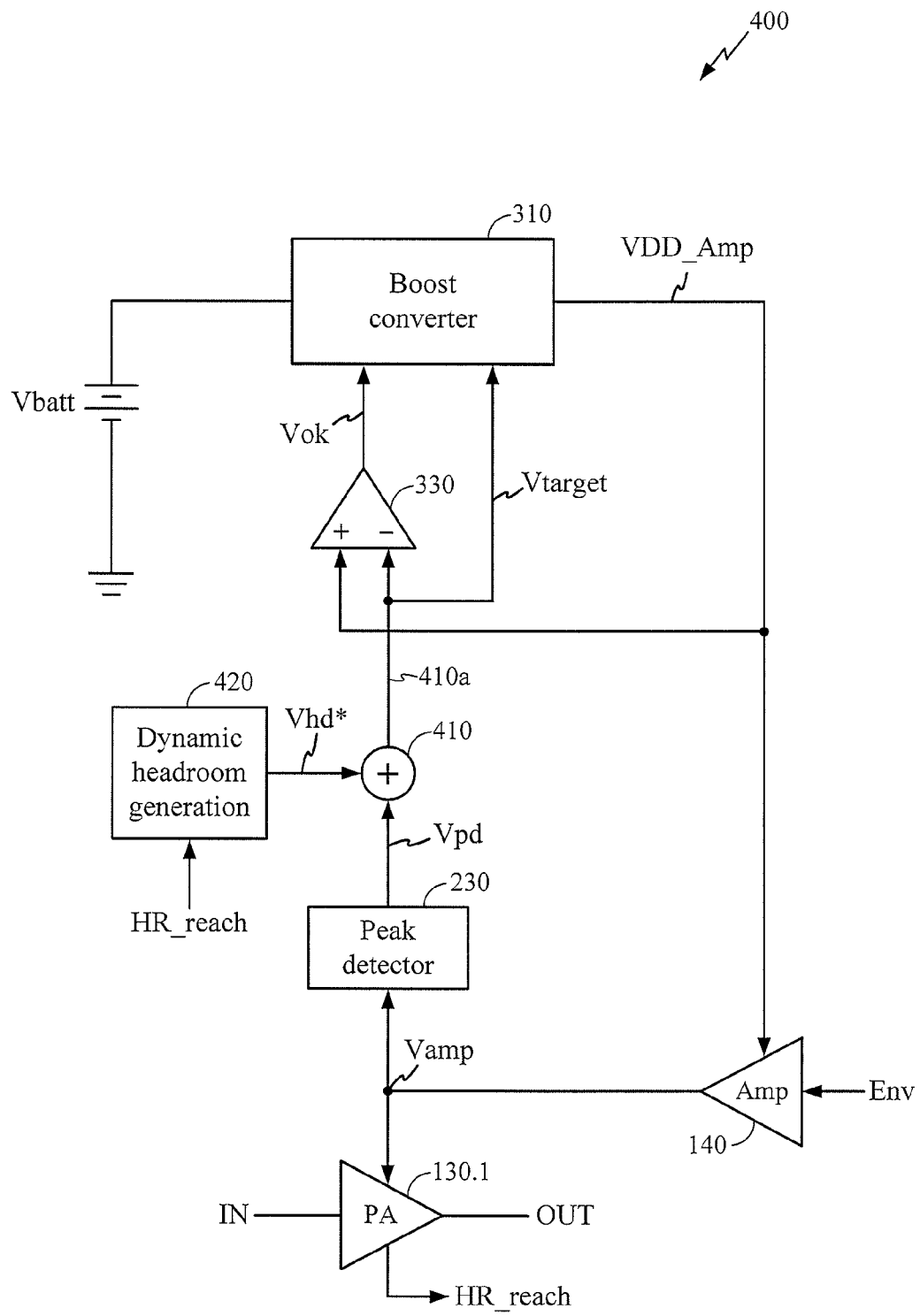
FIG. 4 illustrates an exemplary embodiment of an ET system according to the present disclosure.

FIG. 4 illustrates an exemplary embodiment of an ET system 400 according to the present disclosure. In FIG. 4, a dynamic headroom generation block 420 receives the voltage HR_reach from PA 130.1, and generates a headroom voltage Vhd* to be added to Vpd by adder 410. In an exemplary embodiment, Vhd* is updated over time from an initial headroom voltage Vhd_init to one or more subsequent values that more closely approximates Vhd_opt for a given operating scenario. The headroom generation block 420 may be understood as generating a "dynamic" headroom voltage that changes at least once over time.

Figure 5:
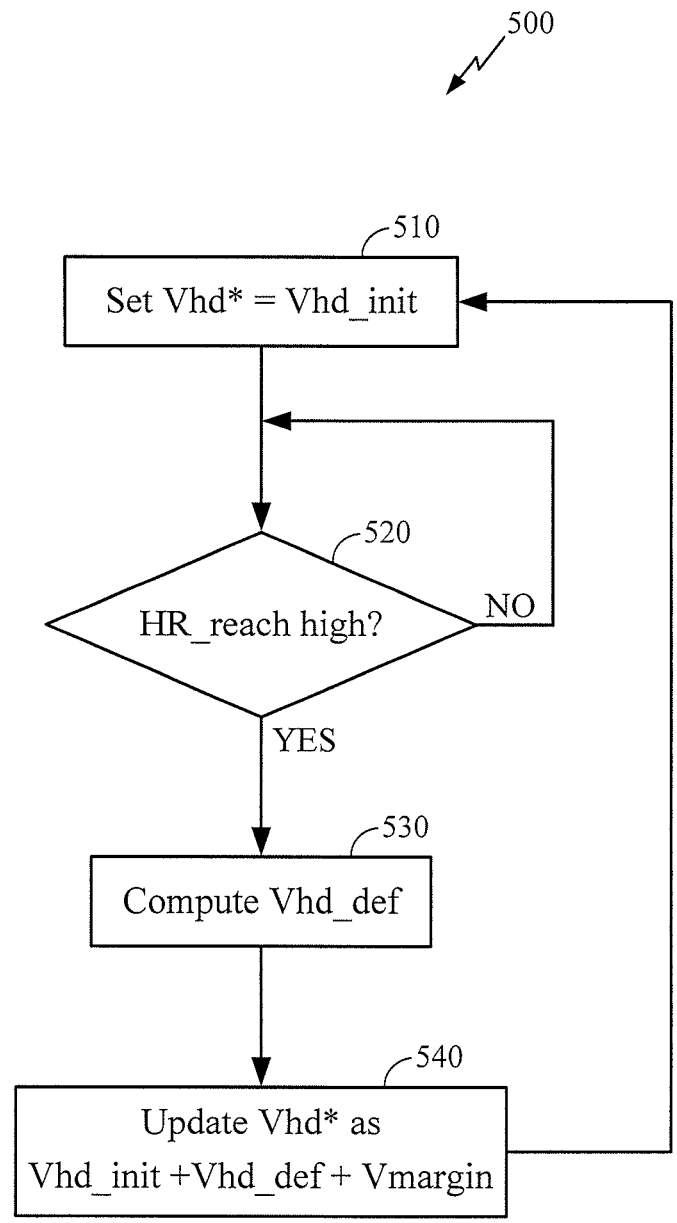
FIG. 5 illustrates an exemplary embodiment of a method that may be implemented by the dynamic headroom generation block.

In particular, FIG. 5 illustrates an exemplary embodiment of a method 500 that may be implemented by the dynamic headroom generation block 420. Note the method 500 is shown for illustrative purposes only, and is not meant to limit the scope of the present disclosure to any particular method shown, or to restrict the dynamic headroom generation block 420 to only those exemplary embodiments implementing the method 500.

In FIG. 5, at block 510, Vhd* is set to an initial value Vhd_init. In an exemplary embodiment, Vhd_init may be chosen to correspond to a fixed predetermined value, e.g., 400 mV. Note Vhd_init may generally be chosen to correspond to an initial best estimate for the required Vhd.

At block 520, it is checked whether HR_reach is high. This may indicate, e.g., that one or more transistors (not shown) in the PA 130 is saturated, as previously described hereinabove. If HR_reach is high, then the method may proceed to block 530. If not, then the method may repeat block 520.

At block 530, responsive to detecting HR_reach being high, a voltage Vhd_def, also denoted a "deficiency voltage," is computed as follows (Equation 1):

$$Vhd\_def = VDD\_Amp - (Vpd + Vhd\_init).$$

In particular, the sum of the detected peak voltage Vpd and the initial headroom voltage Vhd_init is subtracted from the current supply voltage VDD_Amp of the amplifier 140. Due to this subtraction being performed concurrently with detecting HR_reach to be high, it will be appreciated that Vhd_def provides a measure of the deficiency (or surplus) in the headroom voltage when one or more transistors of PA 130 reach saturation. In an exemplary embodiment, Equation 1 is computed soon after detecting HR_reach is high, such that the value of Vpd may accurately (e.g., with minimal delay) reflect the corresponding value in Vamp that caused HR_reach to be asserted high.

At block 540, Vhd* is updated as follows (Equation 2):

$$Vhd^* = Vhd\_init + Vhd\_def + V\text{margin};$$

wherein Vmargin, also denoted a "voltage margin," is a fixed predetermined positive margin, e.g., 50 mV.

Note per Equation 1, if Vhd_def is a positive quantity, i.e., VDD_Amp >(Vpd+Vhd_init), this may correspond to the case wherein Vhd_init<Vhd_opt, i.e., Vhd_init is too low an estimate of Vhd_opt. In this case, per Equation 2, Vhd* may be increased by adding Vhd_def (a positive quantity) to Vhd_init, plus a margin Vmargin. On the other hand, if Vhd_def is a negative quantity, i.e., VDD_Amp<(Vpd+ Vhd_init), this may correspond to the case wherein Vhd_init>Vhd_opt, i.e., Vhd_init is too high an estimate of Vhd_opt. In this case, per Equation 2, Vhd* may be decreased by adding Vhd_def (a negative quantity) to Vhd_init, plus a margin Vmargin.

Note in certain cases, Vhd_init>Vhd_opt would result in HR_reach being low when the detection at block 520 is performed, and thus the method 500 may not progress to blocks 530, 540 in these cases.

Per the operations described above, it will be appreciated that Vhd* is updated at a time corresponding to HR_reach being detected to be high, and Vhd* may accordingly be updated to a value corresponding to the headroom required at the time when HR_reach is detected to be high.

In an exemplary embodiment, following the update of Vhd* at block 540, no further updates to Vhd* need be performed, and the ET system 400 may function with the updated value of Vhd*. In alternative exemplary embodiments (not shown), additional updates to Vhd* may further be performed following block 540. For example, following a fixed time interval after block 540, and/or a transition in HR_reach from high to low, a method according to an alternative exemplary embodiment may return to block 520 to wait for the next instant when HR_reach is detected to be high. In this manner, Vhd* may be updated multiple times as necessary. Such alternative exemplary embodiments are contemplated to be within the scope of the present disclosure.

Returning to FIG. 4, it will be seen that the dynamic headroom generation block 420 will initially output a value of Vhd* corresponding to Vhd_init, e.g., when the method 500 is executing block 510, 520, or 530. Subsequently, in response to detecting HR_reach being high, Vhd* may be updated as according to Equations 1 and 2 described hereinabove, and the updated value of Vhd* may be subsequently asserted, e.g., after the method 500 reaches block 540.

Note as shown in FIG. 4, Vhd* is utilized in the generation of both Vtarget and Ven. In particular, Vhd* may be added to Vpd by adder 410 to directly generate 410a or Vtarget, which is provided to the boost converter 310 to set the target level for VDD_Amp. Furthermore, the voltage 410a or Vtarget is provided to the negative (−) terminal of comparator 330 to generate Vok, which may be utilized (e.g., following latching and logical inversion) by the boost converter 310 derive the enable voltage Ven.

Figure 6:
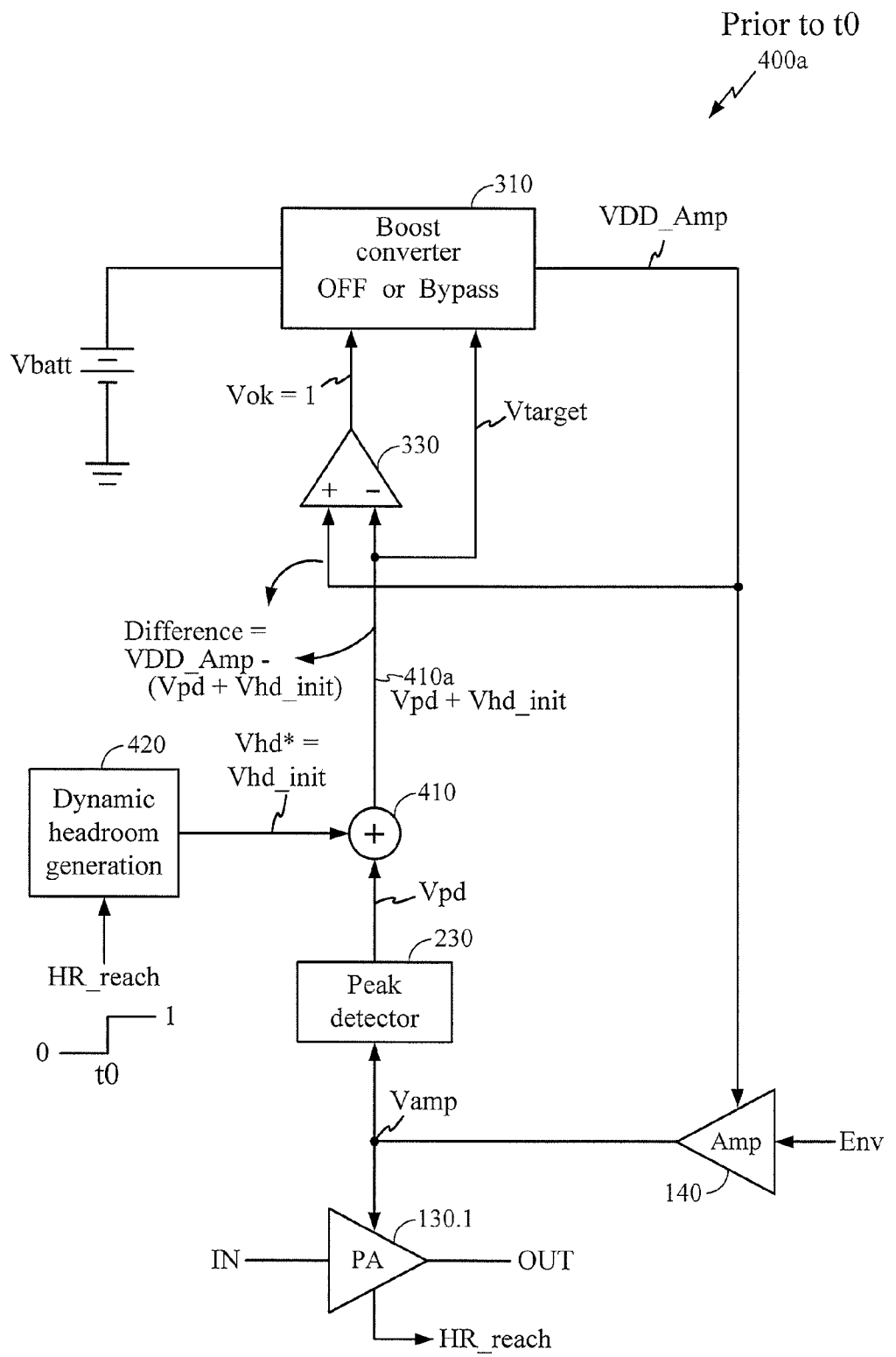
FIGS. 6 and 7 illustrate an exemplary operating scenario according to the techniques of the present disclosure described hereinabove.
Figure 7:
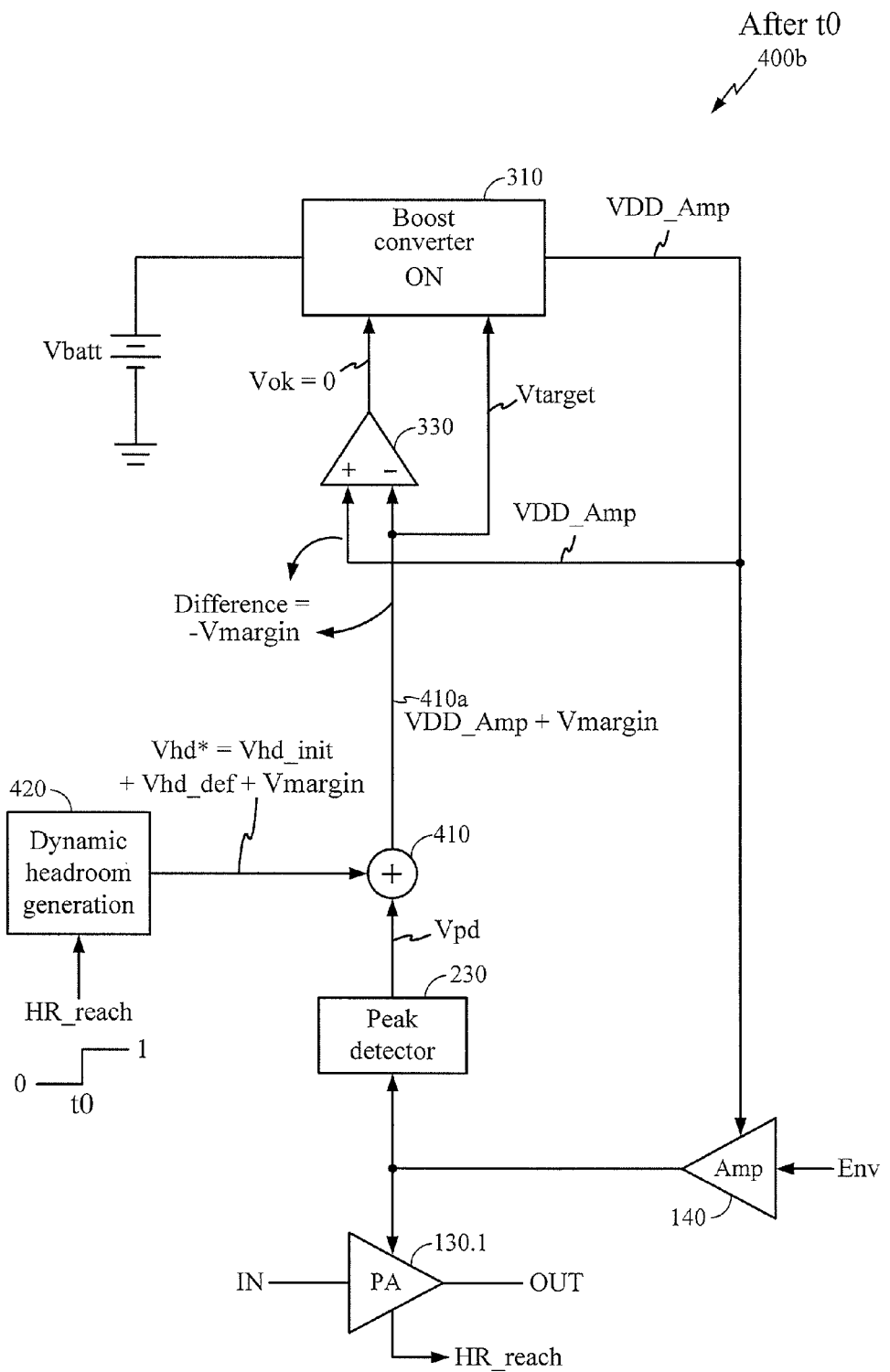

FIGS. 6 and 7 illustrate an exemplary operating scenario according to the techniques of the present disclosure described hereinabove. Note the operating scenario of FIGS. 6 and 7 is described for illustrative purposes only, and is not meant to limit the scope of the present disclosure in any way.

In FIG. 6, an initial state of the ET system 400 prior to a time t0 is shown, wherein Vhd* is initially set to Vhd_init. In an exemplary embodiment, Vhd_init may be, e.g., 400 mV. Prior to time t0, Vhd init provides sufficient headroom for the PA 130.1, and accordingly HR_reach will be low. The output 410a of adder 410 will correspond to (Vpd+Vhd_init), and the difference between the positive (+) and negative (−) terminals of comparator 330 is VDD_Amp−(Vpd+Vhd init). Note VDD_Amp−(Vpd+Vhd_init) is expected to be positive prior to t0, and thus the output Vok of comparator 330 is expected to be high, with the boost converter 310 being OFF or in bypass mode. Further shown in FIG. 6 is that HR_reach transitions from low to high at time t0 in response to, e.g., detection that the PA 130.1 has insufficient headroom, as previously described hereinabove.

FIG. 7 illustrates a state of the ET system 400 following t0, e.g., after Vhd* has been updated according to Equation 2 as described with reference to block 540 hereinabove. In FIG. 7, the updated Vhd* is equal to Vhd_init+Vhd_def+Vmargin. The output 410a of adder 410 will thus correspond to (Vpd+Vhd_init+Vhd def+Vmargin), or VDD_Amp +Vmargin. Per Equation 1 defining Vhd_def, the difference between the positive (+) and negative (−) terminals of comparator 330 simplifies to −Vmargin. As Vmargin is set to a positive value, and −Vmargin is thus negative, the output of comparator 330 is expected to be low. In this case, Ven derived by the boost converter 310 will be high, causing the boost converter 310 to be enabled, and VDD_Amp will accordingly be driven to the target voltage Vtarget corresponding to Vhd_init+Vhd_def+Vmargin+Vpd.

As illustrated in FIG. 7, providing the additive term Vmargin in the updated Vhd* advantageously ensures timely startup of the boost converter 310, as the presence of Vmargin above the required headroom of VDD_Amp−Vpd (when HR_reach is high) will cause the output Vok of comparator 330 to toggle from high to low (and, accordingly, Ven to toggle from low to high).

Figure 8:
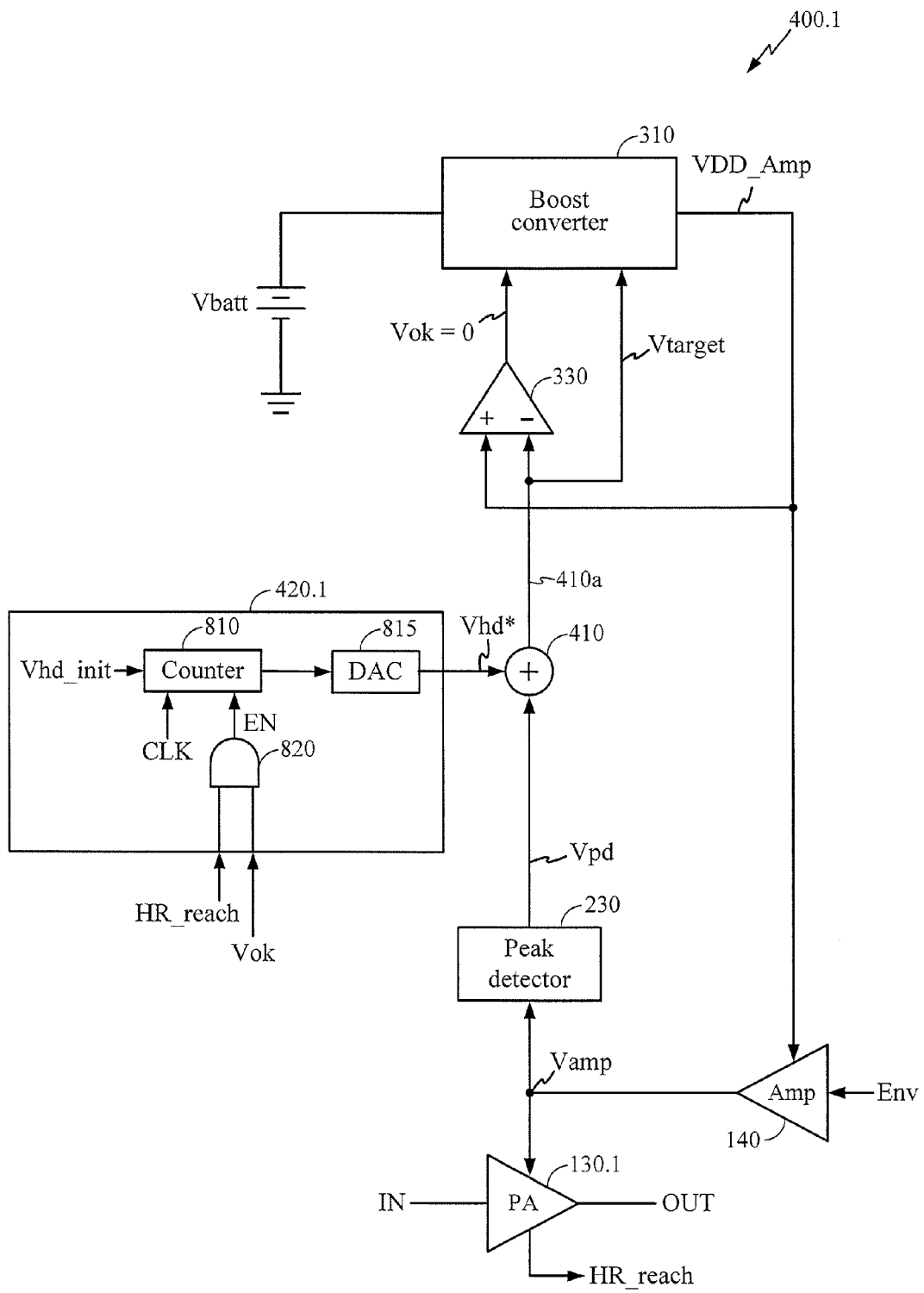
FIG. 8 illustrates an exemplary embodiment of the ET system according to the present disclosure, wherein a specific exemplary embodiment of the dynamic headroom generation block is shown.

FIG. 8 illustrates an exemplary embodiment 400.1 of the ET system 400 according to the present disclosure, wherein a specific exemplary embodiment 420.1 of the dynamic headroom generation block 420 is shown. Note FIG. 8 is shown for illustrative purposes only, and is not meant to limit the scope of the present disclosure to any particular exemplary embodiment of a dynamic headroom generation block shown.

In FIG. 8, the dynamic headroom generation block 420.1 includes an AND gate 820 and a counter 810 driven by a clock signal CLK. The counter 810 may include, e.g., an N-bit register (not shown) initialized to a value corresponding to Vhd_init. When the output EN of the AND gate 820 is low, the counter 810 is disabled, and the counter output Vhd* is constant at Vhd_init. Upon detecting the output EN of the AND gate 820 to be high, the counter 810 is enabled, and thereby starts to increment its N-bit register value on each rising (or alternatively, falling) edge of CLK. When EN is low, the counter 810 is disabled, and thereby stops incrementing its register contents. In an exemplary embodiment, a digital-to-analog converter (DAC) 815 may be provided at the output of the counter 810 to convert the digital output of the counter 810 to an analog signal.

The real-time operation of the dynamic headroom generation block 420.1 in the ET system 400.1 may be described as follows. In an initial state, HR_reach is low, and Vok is high. This corresponds to a state wherein the PA 130.1 is operating with sufficient headroom, and VDD_Amp is greater than Vpd+Vhd*. The output EN of AND gate 820 is thus low, and thus the counter 810 is disabled, with Vhd* being equal to the initial value of Vhd_init.

In a second state, HR_reach is detected to be high, indicating that the PA 130.1 does not have sufficient headroom. As HR_reach and Vok are both high, the output EN of AND gate 820 is also high, and the counter 810 is accordingly enabled. While EN is high, the counter 810 increments its register value successively on every rising edge of CLK. The incrementing continues until EN transitions low, at which time the counter 810 is disabled. Note EN may transition low in response to, e.g., Vok transitioning from high to low, and this may in turn be caused by, e.g., Vhd*+Vpd, or voltage 410a eventually exceeding VDD_Amp by some margin, due to the continual incrementing in Vhd*. Note once the counter 810 is disabled, the then-existing value of the N-bit register in counter 810 is preserved, and thereafter maintained as the updated headroom voltage Vhd*.

Figure 9:
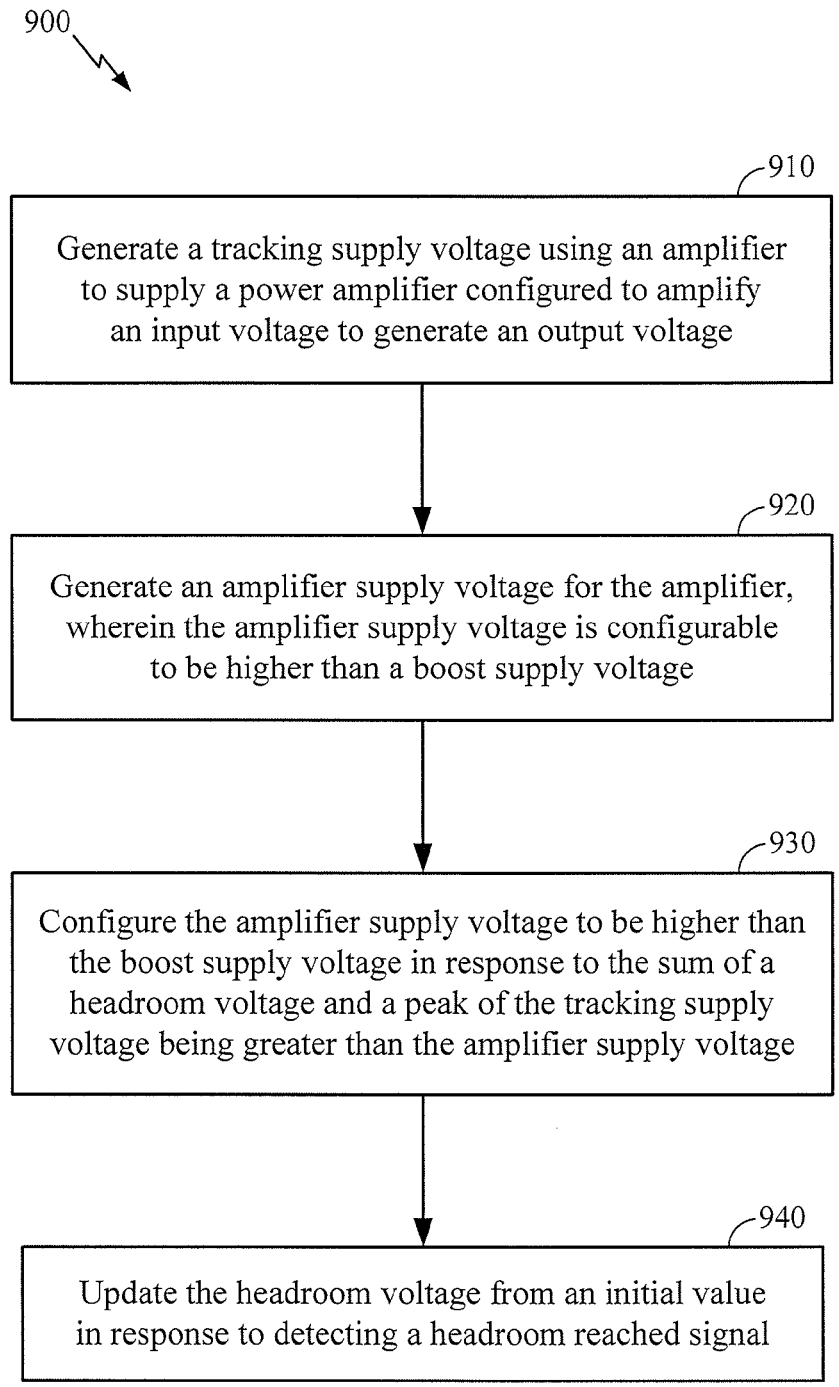
FIG. 9 illustrates an exemplary embodiment of a method according to the present disclosure.

FIG. 9 illustrates an exemplary embodiment of a method 900 according to the present disclosure. Note FIG. 9 is shown for illustrative purposes only, and is not meant to limit the scope of the present disclosure to any particular exemplary embodiment of a method shown.

In FIG. 9, at block 910, a tracking supply voltage is generated using an amplifier to supply a power amplifier configured to amplify an input voltage to generate an output voltage.

At block 920, an amplifier supply voltage is generated for the amplifier, wherein the amplifier supply voltage is configurable to be higher than a boost supply voltage.

At block 930, the amplifier supply voltage is configured to be higher than the boost supply voltage in response to the sum of a headroom voltage and a peak of the tracking supply voltage being greater than the amplifier supply voltage.

At block 940, the headroom voltage is updated from an initial value in response to detecting a headroom reached voltage, e.g., HR_reach. In an exemplary embodiment, the HR_reach signal indicates whether the amplifier is operating with insufficient headroom.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Furthermore, when an element is referred to as being "electrically coupled" to another element, it denotes that a path of low resistance is present between such elements, while when an element is referred to as being simply "coupled" to another element, there may or may not be a path of low resistance between such elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. An apparatus comprising:
a power amplifier supplied by a first supply voltage;
a peak detector configured to detect a peak of the first supply voltage;
a dynamic headroom generation block configured to generate a dynamic headroom voltage by updating an initial headroom voltage based on the peak of the first supply voltage, in response to detecting a headroom reached signal provided to the dynamic headroom generation block;
a second amplifier supplied by an amplifier supply voltage and configured to generate the first supply voltage, the amplifier supply voltage being based on the dynamic headroom voltage; and
a counter configured to receive the headroom reached signal, wherein the counter is configured to be enabled in response to detecting the headroom reached signal and based on the amplifier supply voltage and the peak of the first supply voltage.

2. The apparatus of claim 1, wherein the updated headroom voltage comprises a sum of the initial headroom voltage, a deficiency voltage, and a voltage margin.

3. The apparatus of claim 2, wherein the deficiency voltage comprises the difference between the amplifier supply voltage and the sum of the peak of the first supply voltage and the initial headroom voltage.

4. The apparatus of claim 1, wherein the updated headroom voltage comprises the sum of a voltage margin and a difference between the amplifier supply voltage and a peak of the first supply voltage.

5. The apparatus of claim 1, wherein the counter is initialized with a value corresponding to the initial headroom voltage, and is configured to be enabled based a signal indicating that the amplifier supply voltage is less than a sum of the headroom voltage and the peak of the first supply voltage.

6. The apparatus of claim 5, the counter being coupled to a clock, the counter configured to, when enabled, increment its value in response to a rising edge of the clock.

7. The apparatus of claim 1, wherein the dynamic headroom generation block is configured to update the headroom voltage once in response to detecting the headroom reached signal.

8. A method comprising:
supplying a first supply voltage to a power amplifier;
detecting a peak of the first supply voltage;
setting a headroom voltage to an initial value;
detecting a headroom reached voltage signal, wherein the detecting the headroom reached voltage signal comprises receiving the headroom reached voltage signal;
updating the headroom voltage from the initial value based on the peak of the first supply voltage, when the headroom reached signal is detected;
supplying an amplifier supply voltage to a second amplifier to generate the first supply voltage, the amplifier supply voltage being based on a dynamic headroom voltage; and
receiving, by a counter, the headroom reached signal, wherein the counter is enabled in response to detecting the headroom reached signal and based on the amplifier supply voltage and the peak of the first supply voltage.

9. The method of claim 8, the updating comprising:
initializing the counter with the initial value;
in response to detecting the headroom reached signal and the signal indicating that the amplifier supply voltage is less than the sum of the headroom voltage and the peak of the first supply voltage, incrementing the counter on every rising edge of a clock signal;
disabling the counter when either the headroom reached signal is false or when the amplifier supply voltage is not less than the sum of the headroom voltage and the peak of the first supply voltage.

10. The method of claim 8, the updating comprising updating the headroom voltage once in response to detecting the headroom reached signal.

11. An apparatus comprising:
a power amplifier supplied by a first supply voltage;
a peak detector configured to detect a peak of the first supply voltage;
means for generating a dynamic headroom voltage by updating an initial headroom voltage based on the peak of the first supply voltage, in response to detecting a headroom reached signal provided to the means for generating the dynamic headroom voltage;
a second amplifier supplied by an amplifier supply voltage and configured to generate the first supply voltage, the amplifier supply voltage being based on the dynamic headroom voltage; and
a counter configured to receive the headroom reached signal, wherein the counter is configured to be enabled in response to detecting the headroom reached signal and based on the amplifier supply voltage and the peak of the first supply voltage.

12. The apparatus of claim 11,
wherein the counter is initialized with the initial value, and the counter is configured to be enabled in response to detecting the headroom reached signal and the signal indicating that the amplifier supply voltage is less than the sum of the headroom voltage and the peak of the supply voltage.

13. The apparatus of claim 11, wherein the counter is configured to update the headroom voltage once in response to detecting the headroom reached signal.

* * * * *